United States Patent
Kim

(10) Patent No.: US 9,143,705 B2
(45) Date of Patent: Sep. 22, 2015

(54) SIGNAL PROVIDING APPARATUS, AND ANALOG-TO-DIGITAL CONVERTING APPARATUS AND IMAGE SENSOR USING THE SAME

(71) Applicant: SK hynix Inc., Icheon-si Gyeonggi-do (KR)

(72) Inventor: Eun Jun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 13/712,034

(22) Filed: Dec. 12, 2012

(65) Prior Publication Data
US 2013/0147995 A1 Jun. 13, 2013

(30) Foreign Application Priority Data
Dec. 13, 2011 (KR) .................. 10-2011-0133744

(51) Int. Cl.
| | |
|---|---|
| H04N 5/225 | (2006.01) |
| H04N 5/335 | (2011.01) |
| H03M 1/12 | (2006.01) |
| H03K 5/00 | (2006.01) |
| H03M 1/56 | (2006.01) |
| H04N 5/357 | (2011.01) |
| H04N 5/374 | (2011.01) |
| H04N 5/378 | (2011.01) |

(52) U.S. Cl.
CPC ............. *H04N 5/335* (2013.01); *H03K 5/00* (2013.01); *H03M 1/12* (2013.01); *H03M 1/56* (2013.01); *H04N 5/3575* (2013.01); *H04N 5/374* (2013.01); *H04N 5/378* (2013.01); *H03M 1/123* (2013.01)

(58) Field of Classification Search
CPC ..... H04N 5/378; H04N 5/374; H04N 5/3575; H03M 1/12; H03M 1/56
USPC ................................................ 348/294–324
See application file for complete search history.

(56) References Cited

U.S. PATENT DOCUMENTS

| | | | | |
|---|---|---|---|---|
| 2007/0182838 | A1* | 8/2007 | Lee .............................. | 348/308 |
| 2011/0043676 | A1* | 2/2011 | Lim et al. ..................... | 348/308 |
| 2012/0113286 | A1* | 5/2012 | Lim et al. .................... | 348/222.1 |
| 2012/0133808 | A1* | 5/2012 | Park et al. .................... | 348/294 |
| 2013/0070135 | A1* | 3/2013 | Bahukhandi et al. ......... | 348/300 |

* cited by examiner

*Primary Examiner* — Twyler Haskins
*Assistant Examiner* — Dwight C Tejano
(74) *Attorney, Agent, or Firm* — William Park & Associates Ltd.

(57) ABSTRACT

An image sensor includes: a plurality of image pixels providing a reset signal and a data signal; a signal providing apparatus generating a ramp signal, and sequentially providing the reset signal, the data signal, and the ramp signal; and an analog-to-digital converting apparatus converting the data signal into a digital signal by using a first timing at which the amplitude of the ramp signal is changed based on the amplitude of the reset signal and a second timing at which the amplitude of the ramp signal is changed based on the amplitude of the data signal, wherein the reset signal used to generate the ramp signal and the data signal which has been converted into the data digital signal may be output from the same image pixel.

8 Claims, 11 Drawing Sheets

SIGNAL PROVIDING APPARATUS, AND ANALOG-TO-DIGITAL CONVERTING APPARATUS AND IMAGE SENSOR USING THE SAME

CROSS-REFERENCE TO RELATED APPLICATIONS

The present application claims priority under 35 U.S.C. 119(a) to Korean Patent Application No. 10-2011-0133744 filed on Dec. 13, 2011, in the Korean Intellectual Property Office, the disclosure of which is incorporated by reference herein in its entirety.

BACKGROUND OF THE INVENTION

1. Field of the Invention

Embodiments of the inventive concept relate to a signal providing apparatus, and an analog-to-digital converting apparatus and an image sensor using the same.

2. Description of the Related Art

An image sensor is commonly used in applications such as digital photographs, scanners, machine vision systems, monitoring cameras, and the like. While a charge coupled device (CCD) image sensor has been used in these applications for a relatively long period of time, a complementary metal oxide semiconductor (CMOS) image sensor is increasingly being used instead the CCD image sensor. CMOS image sensors are advantageous in that, for example, like an image processing circuit, the CMOS image sensor can be fabricated together with peripheral circuits on the same chip, and thus, CMOS image sensors can be configured as a "camera on a chip" and can be used in other applications. Also, since the CMOS image sensor is fabricated by using a general CMOS fabrication technique, CMOS image sensor fabrication incurs low fabrication costs in comparison with fabricating CCD image sensors.

FIG. 1 is a view showing a configuration of a related art image sensor.

An image sensor generally uses a "column parallel architecture" in which a plurality of image pixels are arranged to have a square shape with rows and columns. Image pixels in respective columns are connected to column data lines, and the respective column data lines are selected row by row so as to be driven.

With reference to FIG. 1(a), the prior art image sensor—comprising photo diodes, amplifiers, select switches, column lines, and correlated double sample modules, among others—receives analog image signals output from all the image pixels of a column and converts the analog image signals into digital signals by using a single analog-to-digital converter (ADC).

According to the ADC scheme of FIG. 1(a), it can be seen that as the degree of image sensor integration is increased, the operating speed of the ADC should be linearly increased. Namely, in order to output data with respect to an image frame at the same rate, the ADC should process data from all pixels belonging to the frame at the same time (simultaneously) and the speed of the ADC should be increased in proportion to the number of pixels. However, a high speed ADC is costly and it may be difficult to implement such a high speed ADC.

Also, since the speed of outputting data in columns should be increased, more noise is inevitably generated due to data interference between columns.

With reference to FIG. 1(b), recently, the related art image sensor may employ a column-parallel-ADC scheme in which ADCs are disposed by column and an analog image signal is converted into a digital signal by column.

According to the ADC scheme illustrated in FIG. 1(b), an operation speed of the ADC may be required to be proportional to the number of rows, so it is proportional to a square root of the degree of integration. Thus, in comparison to the conventional scheme, the ADC may be designed to have a low speed. In addition, since analog signals are converted by column, column fixed pattern noise can be reduced.

SUMMARY OF THE INVENTION

One or more embodiments may provide a signal providing apparatus and an analog-to-digital converting apparatus and an image sensor using the same.

According to an aspect of the inventive concept, there is provided a signal providing apparatus including: a first signal line transferring a first signal and a third signal; a second signal line transferring a second signal and the third signal; a third signal line connected to the first and second signal lines; and a signal generation unit receiving the first signal through the third signal line while the first signal is being transferred through the first signal line, generating the third signal by using level information of the first signal, and providing the third signal to each of the first and second signal lines through the third signal line, wherein the second signal and the third signal may be transferred through the second signal line at different times.

According to another aspect of the inventive concept, there is provided a signal providing apparatus including: a first signal line transferring a first signal, a second signal, and a third signal; a third signal line connected to the first signal line; and a signal generation unit receiving the first signal through the third signal line while the first signal is being transferred through the first signal line, generating the third signal by using level information of the first signal, and providing the third signal to the first signal line through the third signal line, wherein the first signal, the second signal, and the third signal may be transferred through the first signal line at different times.

According to another aspect of the inventive concept, there is provided an analog-to-digital converting apparatus including: a signal providing apparatus receiving a first data signal and a second data signal, generating a comparison signal by using level information of the first data signal, and sequentially providing the first data signal, the second data signal, and the comparison signal; a multi-signal comparison unit outputting a first timing signal when the amplitude of the comparison signal is changed based on the amplitude of the first data signal and outputting a timing signal when the amplitude of the comparison signal is changed based on the amplitude of the second data signal; a counter unit outputting a counter signal having a value increased or decreased over time; and a storage unit storing the counter signal when the first timing signal is transferred, and storing the counter signal when the second timing signal is transferred.

According to another aspect of the inventive concept, there is provided an image sensor including: a plurality of image pixels providing a reset signal including reset information regarding a light receiving unit and a data signal obtained by converting light applied to the light receiving unit into an electrical signal; a signal providing apparatus receiving the reset signal, generating a ramp signal by using information of a level of the reset signal, and sequentially providing the reset signal, the data signal, and the ramp signal; an analog-to-digital converting apparatus converting the data signal into a digital signal by using a first time at which the amplitude of the ramp signal is changed based on the amplitude of the reset signal and a second time at which the amplitude of the ramp signal is changed based on the amplitude of the data signal; and an interface apparatus transferring the data digital signal to an external device, wherein the reset signal used to generate the ramp signal and the data signal which has been converted into the data digital signal is output from the same image pixel.

BRIEF DESCRIPTION OF THE DRAWINGS

The above and other aspects, features and other advantages of the inventive concept will be more clearly understood from the following detailed description taken in conjunction with the accompanying drawings, in which.

DETAILED DESCRIPTION OF THE PREFERRED EMBODIMENT

Figure 1A:
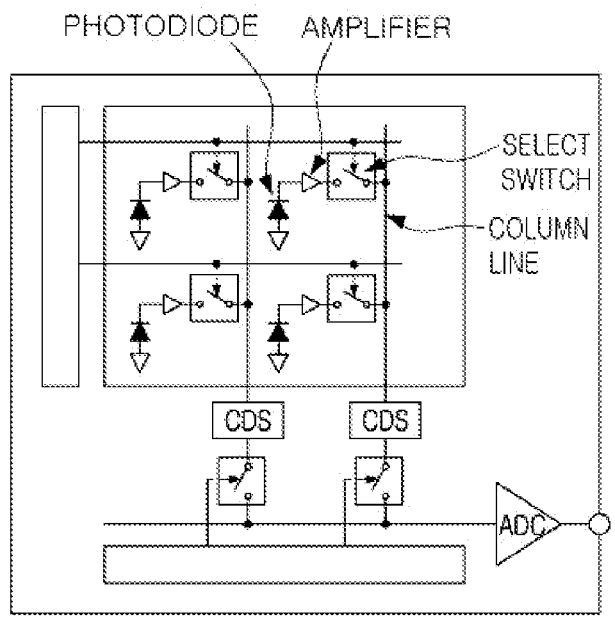
FIGS. 1a and 1b shows a configuration of a related art image sensor.
Figure 1B:
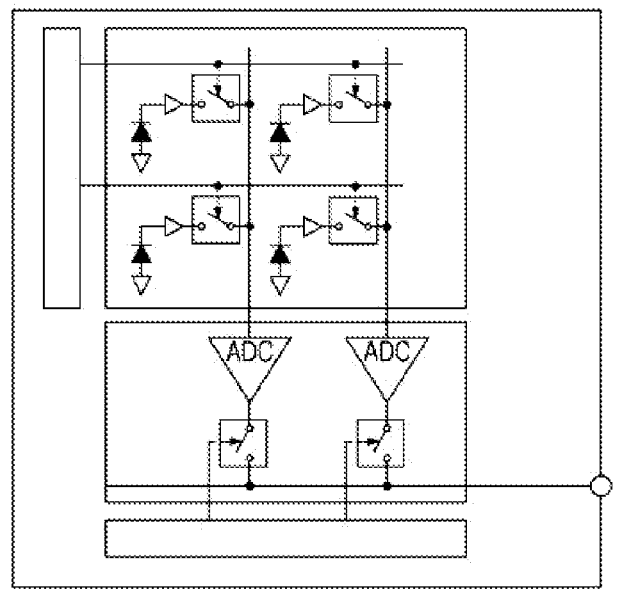

Embodiments of the inventive concept will now be described with reference to the accompanying drawings. The invention may, however, be embodied in many different forms and should not be construed as being limited to the embodiments set forth herein.

In the drawings, the shapes and dimensions of elements may be exaggerated for clarity, and the same reference numerals will be used throughout to designate the same or like components.

Unless explicitly described to the contrary, the word "comprise" and variations such as "comprises" or "comprising," will be understood to imply the inclusion of stated elements but not the exclusion of other elements.

A column-parallel analog-to-digital conversion scheme will be described before describing a signal providing apparatus 100, and an analog-to-digital converting apparatus and an image sensor using the same.

Figure 2:
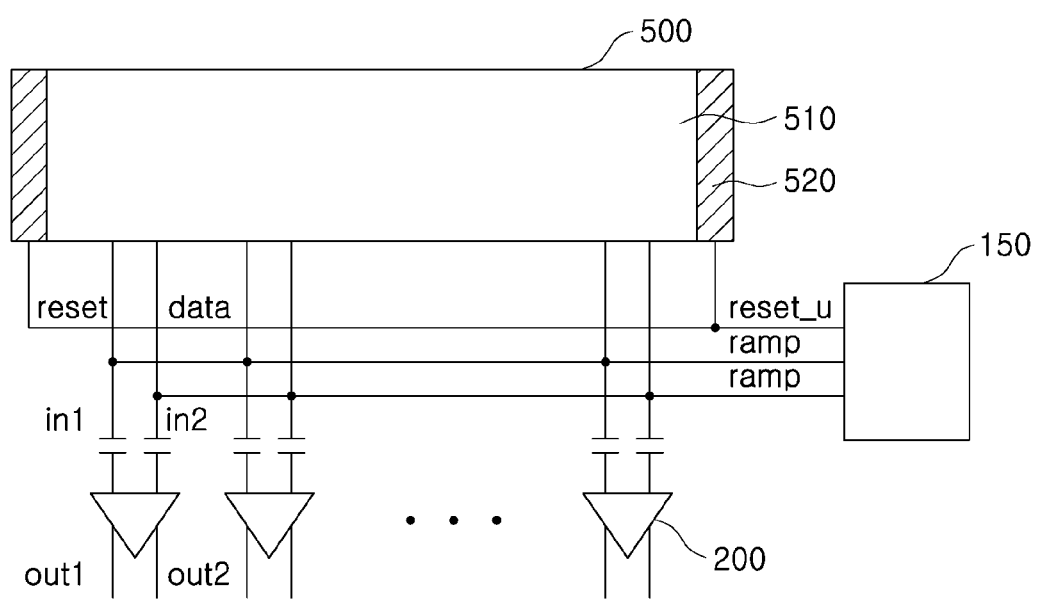
FIG. 2 is a view showing a configuration of a column-parallel analog-to-digital conversion circuit.
Figure 3A:
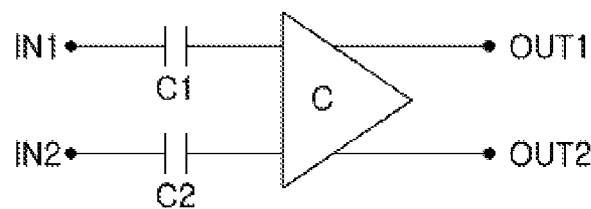
FIGS. 3a and 3b shows a comparator of the column-parallel analog-to-digital conversion circuit and a timing of an input/output signal of the comparator, respectively.
Figure 3B:
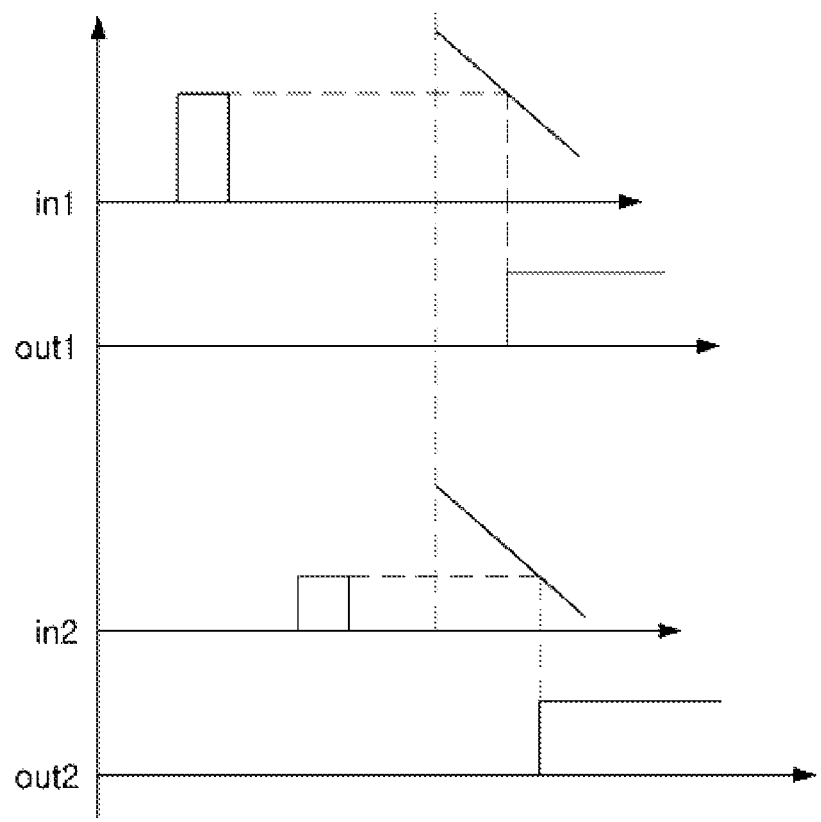

FIG. 2 is a view showing a configuration of a column-parallel analog-to-digital conversion circuit. FIGS. 3a and 3b depict a comparator of the column-parallel analog-to-digital conversion circuit and a timing of an input/output signal of the comparator, respectively.

With reference to FIGS. 2 and 3(a), the column-parallel analog digital conversion scheme uses a multi-signal comparison unit 200 which compares a reset signal (reset) and data signal (data) output from an operational region 510 of a pixel array 500 and outputs comparison results out1 and out2.

Also, the column-parallel analog-to-digital conversion scheme uses a signal generation unit 150 generating a ramp signal (ramp) used in the multi-signal comparison unit 200.

The multi-signal comparison unit 200 outputs a first timing signal out1 when the amplitude of the reset signal (reset) and that of the ramp signal (ramp) are changed, and outputs a second timing signal out2 when the amplitude of the of the data signal (data) and that of the ramp signal (ramp) are changed.

With reference to FIG. 3(a) the multi-signal comparison unit 200 may include a first input terminal IN1 to which the reset signal or the ramp signal is applied, a second input terminal IN2 to which the data signal or the ramp signal is applied, a first output terminal OUT1 from which the first timing signal out1 is output and a second output terminal OUT2 from which the second timing signal OUT2 is output.

The signal generation unit 150 generates the ramp signal (ramp) in response to a reset signal reset_u output from a non-operational region 520 of the pixel array 500 and transfers the ramp signal (ramp) to the multi-signal comparison unit 200.

With reference to FIG. 3(a), input terminals of a comparator (C) of the multi-signal comparison unit 200 are floated. Thus, after the ramp signal (ramp) accurately tracks the reset signal (reset), when a start level of the ramp signal (ramp) and that of the reset signal (reset) are not identical, the data obtained by comparing the reset signal (reset) with the ramp signal (ramp) and the data obtained by comparing the data signal (data) and the ramp signal (ramp) have errors, respectively. Thus, the finally digital-converted data may have a significant error. Therefore, it is important for the start level of the ramp signal (ramp) transferred to the multi-signal comparison unit 200 to accurately track the level of a reset signal (reset) of an image pixel of the operational region 510.

The ramp signal (ramp) generated by using the reset signal (reset_u) of an image pixel of the non-operational region 520 is applied to the first input terminal IN1 and the second input terminal IN2. Here, however, with reference to FIG. 3(b), it is noted that the start level of the ramp signal (ramp) is not identical to the level of the reset signal (reset) of the image pixel of the operational region 510. The reason for this is that image pixels inevitably have a fine error caused in the fabrication process and there is a fine difference of the characteristics between column lines, namely, column fixed pattern noise.

Also, in the scheme illustrated in FIG. 2, dummy column lines are required for obtaining the reset signal (reset_u) from the image pixels of the non-operational region 520.

As discussed above, an apparatus for receiving two certain signals from a circuit that processes an information signal, or the like, generating a third signal reflecting level information of one of the two signals, and transferring the same to a rear stage may be realized.

Hereinafter, an apparatus for receiving two signals and transferring three signals based on level information of one of the two received signals, and an analog-to-digital converting apparatus using the same will be described.

Figure 4:
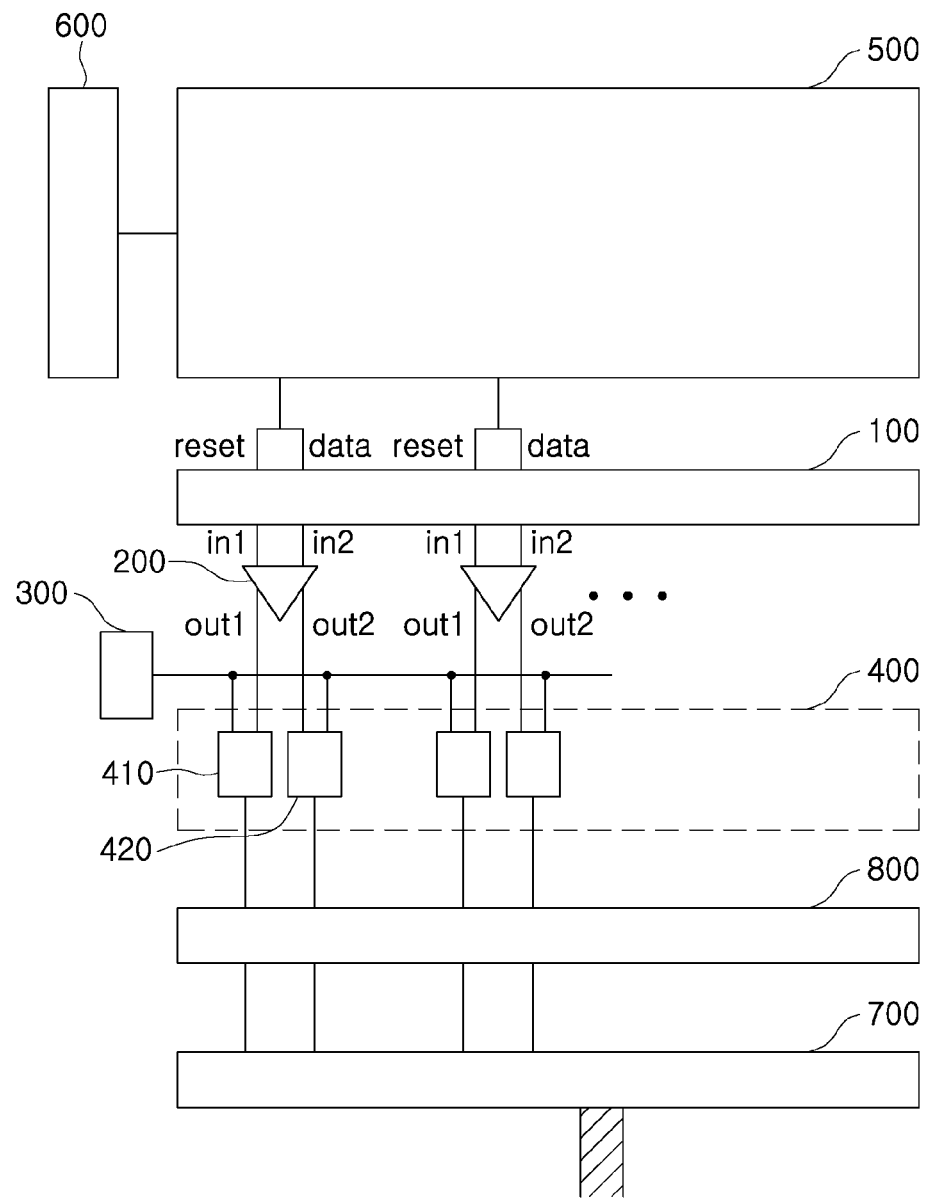
FIG. 4 is a view showing a configuration of an image sensor using a signal providing apparatus according to embodiments of the inventive concept.

FIG. 4 is a view showing a configuration of an image sensor using the signal providing apparatus 100 according to an embodiment of the inventive concept.

With reference to FIG. 4, the image sensor according an embodiment of the inventive concept may include a pixel array 500 including a plurality of image pixels, the signal providing apparatus 100, an analog-to-digital converting apparatus, an interface apparatus 700, a control apparatus 600, and a calculation apparatus 800. The analog-to-digital converting apparatus may include a multi-signal comparison unit 200, a counter unit 300, and a storage unit 400. The storage unit 400 may include a first storage 410 and a second storage 420.

The pixel array 500 may include a plurality of image pixels. The plurality of image pixels may be arranged in lattice form. Each of the image pixels of the pixel array 500 may provide a reset signal (reset) including reset information regarding a light receiving unit and a data signal (data) obtained by converting light made incident to the light receiving unit. Recently, an image pixel having a 4-transistor structure tends to be used.

Upon receiving the reset signal, the signal providing apparatus 100 may generate a ramp signal, and provide the reset signal, the data signal (data), and the ramp signal, as a first input signal in1 and a second input signal in2. For example, the signal providing apparatus 100 may sequentially output the reset signal (reset) and the ramp signal as the first input signal in1, and sequentially output the data signal (data) and the ramp signal as the second input signal in2. Also, the signal providing apparatus 100 may synthesize reset signal level information transferred to respective column lines to generate a ramp signal. In particular, the signal providing apparatus 100 may average the reset signal levels to generate the ramp signal. Details of the signal providing apparatus 100 will be described later.

The analog-to-digital converting apparatus receives the first input signal in1 and the second input signal in2 and outputs digital signals corresponding to the reset signal (reset) and the data signal (data). The analog-to-digital converting apparatus may convert the reset signal (reset) and the data signal (data) into digital signals by using a time at which the amplitude of the ramp signal is changed based on the amplitude of the reset signal and a time at which the amplitude of the ramp signal is changed based on the amplitude of the data signal (data). The analog-to-digital converting apparatus may be an analog-to-digital converting apparatus employing a column-parallel analog-to-digital converting scheme.

The analog-to-digital converting apparatus may include the multi-signal comparison unit 200, the counter unit 300, and the storage unit 400. The storage unit 400 may include the first storage 410 and the second storage 420. Details of the analog-to-digital converting apparatus will be described later.

When the plurality of image pixels are arranged in lattice form within the pixel array 500, the analog-to-digital converting apparatus may be provided for each column. For example, the multi-signal comparison unit 200, the first storage 410, and the second storage 420 of the analog-to-digital converting apparatus may be provided per column.

The interface apparatus 700 may transfer the reset signal (reset) and the data signal (data) which have been converted into digital signals, to an external device. The interface apparatus 700 may convert counter signal values stored in the storage unit 400 into signals having a format appropriate for communication with the external device. Various communication schemes may be applied to communication with the external device, so the image sensor according to an embodiment of the inventive concept may include the interface apparatus 700. Also, the interface apparatus 700 may isolate noise generated from communication with the external device such that noise does not affect the storage unit 400, or the like, of the image sensor.

The control apparatus 600 may select a pixel row comprising a plurality of image pixels where the plurality of pixels may be part of an image to be extracted. The control apparatus 600 may control the plurality of image pixels to sequentially output the reset signal (reset) and the data signal (data).

The calculation apparatus 800 may calculate a difference between the reset signal and the data signal which have been converted into digital signals, to generate an image data signal. The interface apparatus 700 may transfer the image data signal generated by the calculation apparatus 800 to the external device. In order to cancel column-fixed pattern noise of the image pixels, in general, a correlated double sampling (CDS) technique is used. Thus, in order to perform the CDS within the image sensor, the image sensor may further include the calculation apparatus 800.

Namely, the image sensor using the signal providing apparatus 100 generates the ramp signal by directly using the reset signal output from the operation image pixel involving generation of the image data signal. In other words, the data signal used to generate the reset signal and the image data signal used to generate the ramp signal are output, i.e. derived, from the same image pixel. Thus, the start level of the ramp signal and the level of the reset signal of the operation image pixel may be identical. Also, since the image data signal is generated by using the ramp signal and the reset signal generated thusly, and the data signal output from the operation image pixel, an error that may appear from the image data signal can be prevented.

FIGS. 5A through 5D are views showing some of implementation examples of the signal providing apparatus according to an embodiment of the inventive concept.

Figure 5A:
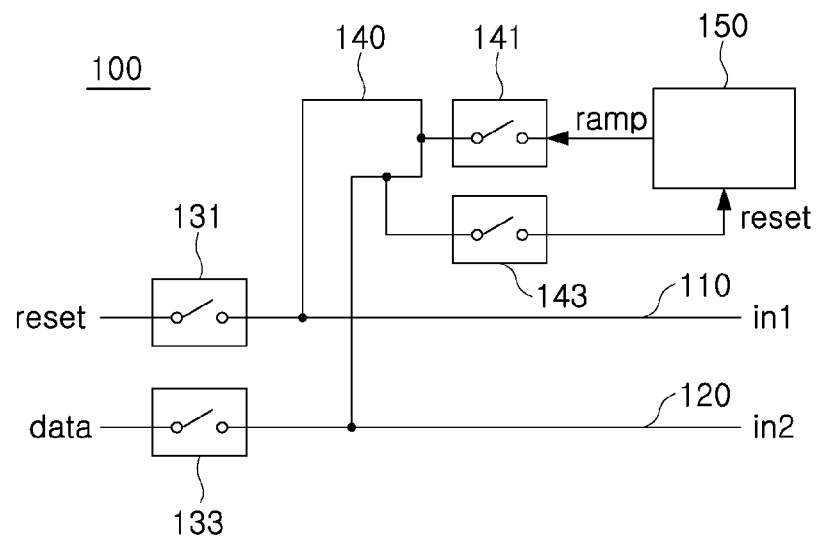
FIGS. 5A through 5D are views showing example signal providing apparatuses according to embodiments of the inventive concept.
Figure 5B:
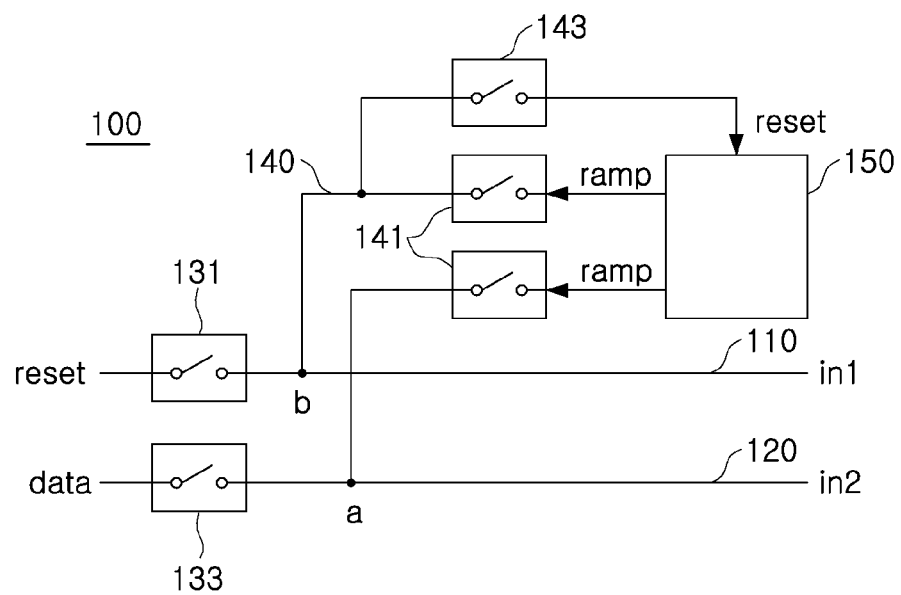
Figure 5C:
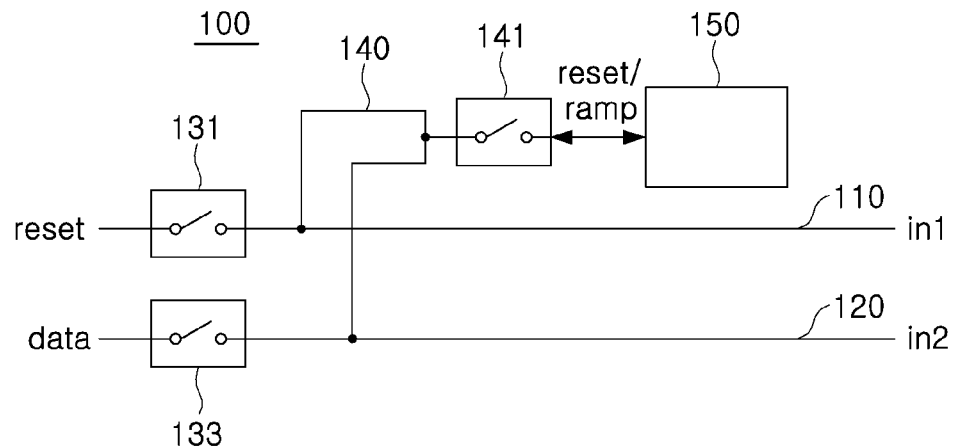

With reference to FIGS. 5A through 5C, the signal providing apparatus 100 according to an embodiment of the inventive concept may include a first signal line 110 transferring the reset signal (reset) and the ramp signal (ramp), a second signal line 120 transferring the data signal (data) and the ramp signal (ramp), and a third signal line 140 connected to the first signal line 110 and the second signal line 120. The signal providing apparatus 100 may also include a signal generation unit 150 receiving the reset signal (reset) through the third signal line 140 while the reset signal (reset) is being transferred through the first signal line 110, generating the ramp signal (ramp) by using level information of the reset signal (reset), and providing the ramp signal (ramp) to the first signal line 110 and the second signal line 120 through the third signal line 140. Also, the signal providing apparatus 100 according to an embodiment of the inventive concept may include a first line controller 131 controlling a transmission of a signal through the first signal line 110, a second line controller 133 controlling a transmission of a signal through the second signal line 120, and third line controllers 141 and 143 controlling a transmission of the reset signal (reset) and a ramp signal (ramp) through the third signal line 140, wherein in some embodiments the third line controllers 141 and 143 may be comprised of a pair of line controllers 141 and 143.

The reset signal (reset) and the ramp signal (ramp) may be transferred at different times through the first signal line 110. In this case, after the reset signal (reset) is transferred, the ramp signal (ramp) may be transferred. The data signal (data) and the ramp signal (ramp) may be transferred at different times through the second signal line 120. In this case, after the data signal (data) is transferred, the ramp signal (ramp) may be transferred.

With reference to FIG. 5A, one of the third line controllers 143 may control a flow of the reset signal (reset) supplied to the signal generation unit 150 through the third signal line 140, and one of the third line controllers 141 may control a flow of the ramp signal (ramp) transferred to the first signal line 110 through the third signal line 140.

With reference to FIG. 5B, one of the third line controllers 143 may control a flow of the reset signal (reset) supplied to the signal generation unit 150 through the third signal line 140, and one of the third line controllers 141 may control a flow of the ramp signal (ramp) transferred to the first signal line 110 through the third signal line 140. In the embodiment illustrated in FIG. 5B, the connection between the third signal line 140 and the first signal line 110, and the connection between the third signal line 140 and the second signal line 120 are mutually independent. Thus, flowing of the reset signal (reset) to the second signal line 120 or flowing of the data signal (data) to the first signal line 110 can be prevented. Also, signal distortion due to a parasitic capacitance between the signal lines when the reset signal (reset) and/or the data signal (data) can also be prevented.

With reference to FIG. 5C, the third line controller 141 may control a flow of the reset signal (reset) supplied to the signal generation unit 150 through the third signal line 140 or control a flow of the ramp signal (ramp) transferred to the first signal line through the third signal line 140.

Namely, as shown in FIGS. 5A and 5B, the signal providing apparatus 100 according to an embodiment of the inventive concept may be configured such that one of the third line controllers 143 controls the flow of the signal transferred to the signal generation unit 150 and one of the third line controllers 141 controls the flow of the signal transferred from the signal generation unit 150, or as shown in FIG. 5C, the signal providing apparatus 100 according to an embodiment of the inventive concept may be configured such that the same third line controller 141 controls the flow of the signal transferred to the signal generation unit 150 or the flow of the signal transferred from the signal generation unit 150. Also, as shown in FIGS. 5A and 5B, the signal generation unit 150 of the signal providing apparatus 100 according to an embodiment of the inventive concept may be designed such that the input terminal for receiving a signal and the output terminal for outputting a signal may be separated, or as shown in FIG. 5C, the signal generation unit 150 of the signal providing apparatus 100 according to an embodiment of the inventive concept may be designed such that input timing and output timing of a signal are synchronized with the third line controller 141 to thereby receive or transfer a signal through a single input/output terminal.

Figure 5D:
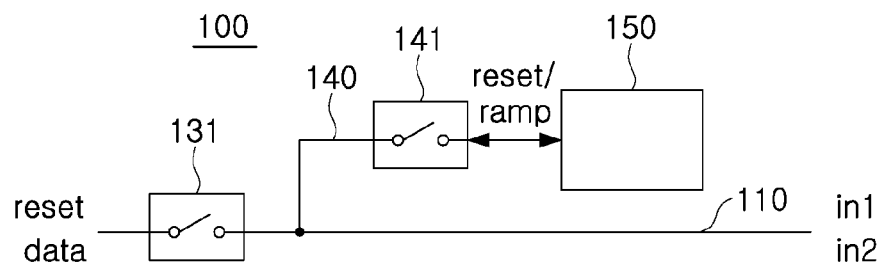

With reference to FIG. 5D, the signal providing apparatus 100 according to an embodiment of the inventive concept may include the first signal line 110, the third signal line 140, and the signal generation unit 150. Also, the signal providing apparatus 100 according to an embodiment of the inventive concept may include the first line controller 131 controlling a transmission of the reset signal (reset) and the data signal (data) and the third line controller 141 controlling a transmission of the reset signal (reset) and the ramp signal (ramp) through the third signal line 140.

The signal line 110 may transfer the reset signal (reset), the data signal (data), and the ramp signal (ramp). In this case, the reset signal (reset), the data signal (data), and the ramp signal (ramp) may be transferred at different times, and in this case, the reset signal (reset), the data signal (data), and the ramp signal (ramp) may be transferred sequentially in this order.

The third signal line 140 is connected to the first signal line 110 and may be a path for transferring the reset signal (reset) to the signal generation unit 140 or for transferring the ramp signal (ramp) generated from the signal generation unit 150 to the first signal line 110.

The signal generation unit 150 may receive the reset signal (reset) through the third signal line 140 while the reset signal (reset) is being transferred through the first signal line 110, generate the ramp signal (ramp) by using the level information of the reset signal (reset), and provide the ramp signal (ramp) to the first signal line 110 through the third signal line 140.

The signal providing apparatus 100 may sequentially output the reset signal (reset), the data signal (data), and the ramp signal (ramp) through the first signal line.

The signal providing apparatus 100 illustrated in FIG. 5D may be used when a device at a rear stage is a comparison device having a single input terminal and controlling a distribution of a signal internally, and also used when a separate controller controlling a flow of a transmission signal exists at a rear stage.

With reference to FIG. 5D, the first line controller 131 may control the flow of the reset signal (reset) and the data signal (data) provided through the first signal line 110, and the third line controller 141 may control the flow of the reset signal (reset) provided to the signal generation unit 150 through the third signal line 140 and the flow of the ramp signal provided to the first signal line 110.

The line controllers 131 and 141 may control the flow of the reset signal (reset), the data signal (data) and the ramp signal (ramp) transferred through respective signal lines. The line controllers 131 and 141 may also adjust a transmission timing of the reset signal (reset), the data signal (data) and the ramp signal (ramp). In particular, the line controllers 131 and 141 may prevent the reset signal (reset), the data signal (data) and the ramp signal (ramp) from overlapping with each other.

Figure 6A:
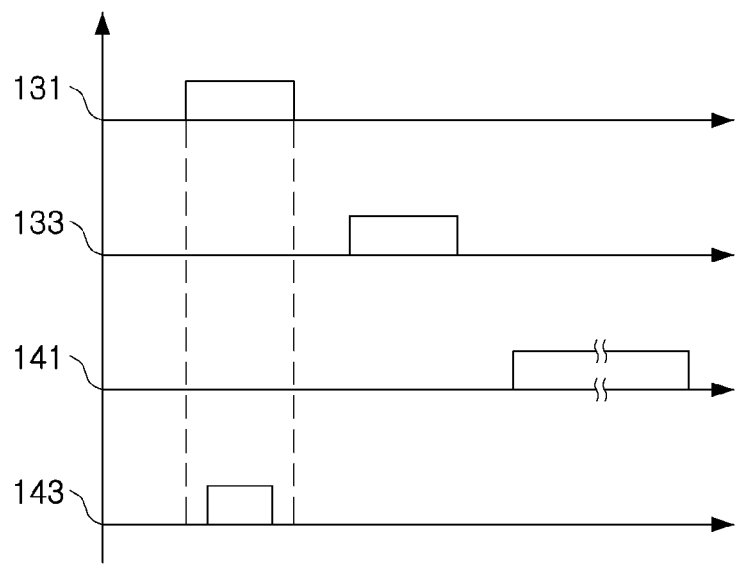
FIGS. 6A through 6C are timing diagrams for explaining operations of example signal providing apparatuses shown in FIGS. 5A through 5D according to embodiments of the inventive concept.
Figure 6B:
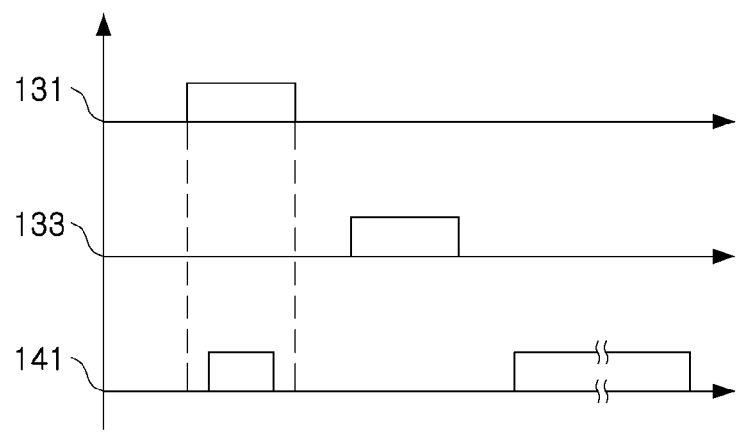
Figure 6C:
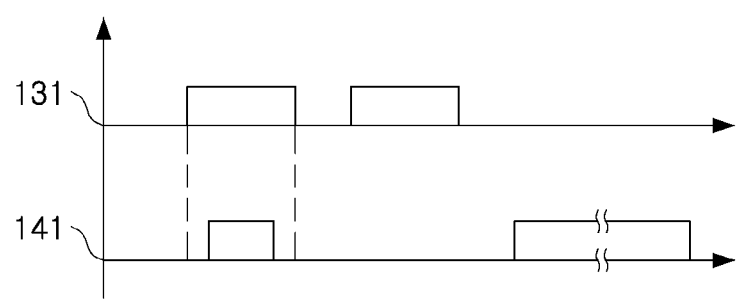

FIGS. 6A through 6C are timing diagrams explaining operations of the signal providing apparatuses shown in FIGS. 5A through 5D according to embodiments of the inventive concept.

Operations of the signal providing apparatus 100 will be described with reference to FIGS. 5A, 5B, and 6A.

When the first line controller 131 is turned on, the third line controller 143 is also turned on, allowing the reset signal (reset) to be transferred through the first signal line 110 and the third signal line 140. The reset signal may also be transferred to a rear stage (e.g., the multi-signal comparison unit 200) of the signal providing apparatus 100 through the first signal line 110, and also to the signal generation unit 150.

When the second line controller 133 is turned on, only the data signal (data) is transferred through the second signal line 120. The data signal (data) is transferred to the rear stage (e.g., the multi-signal comparison unit 200) of the signal providing apparatus 100 through the second signal line.

After the transfer of the data signal (data) through the second signal line 120 is completed, only the third line controller 141 is turned on. Thus, the ramp signal (ramp) is transferred to the rear stage (e.g., the multi-signal comparison unit 200) of the signal providing apparatus 100 through the first signal line 110 and the second signal line 120.

Hereinafter, example operations of the signal providing apparatus 100 will be described with reference to FIGS. 5C and 6B.

While the first line controller 131 is turned on, the third line controller 141 is also turned on, allowing the reset signal (reset) to be transferred through the first signal line 110 and the third signal line 140. The reset signal (reset) is also transferred to the rear stage (e.g., the multi-signal comparison unit 200) of the signal providing apparatus 100 through the first signal line 110 and also to the signal generation unit 150 through the third signal line 140.

When the second line controller 133 is turned on, only the data signal (data) is transferred to the rear stage (e.g., the multi-signal comparison unit 200) of the signal providing apparatus 100 through the second signal line 120.

After transfer of the data signal (data) through the second signal line 120 is completed, the third line controller 141 is turned on and the first and second line controllers 131 and 133 are turned off, allowing the ramp signal (ramp) to be transferred to the rear stage (e.g., the multi-signal comparison unit 200) through the first signal line 110 and the second signal line 120.

Hereinafter, an example operation of the signal providing apparatus 100 of the inventive concept will be described with reference to FIGS. 5D and 6C.

While the first line controller 131 is turned on, the third line controller 141 is also turned on, allowing the reset signal (reset) to be transferred through the first signal line 110 and the third signal line 140. The reset signal (reset) is transferred to the rear stage of the signal providing apparatus 100 through the first signal line and also transferred to the signal generation unit 150 through the third signal line 140.

When the first line controller 131 is turned on, only the data signal (data) is transferred to the rear stage (e.g., the multi-signal comparison unit 200) of the signal providing apparatus 100 through the first signal line 110.

After the transfer of the data signal (data) through the first signal line 110 is completed, only the third line controller 141 is turned on and the first and second line controllers 131 and 133 are turned off, allowing the ramp signal (ramp) to be transferred to the rear stage (e.g., the multi-signal comparison unit 200) of the signal providing apparatus 100 through the first signal line 110.

In the above description with reference to FIGS. 5A to 5D and FIGS. 6A to 6C, the signal providing apparatus 100 is provided to the image sensor, but the signal providing apparatus 100 according to an embodiment of the inventive concept can be applicable to various fields. Namely, the signal providing apparatus 100 may be configured to receive first and second signals, generate a third signal in response to the first signal, and output the first, second, and third signals.

Accordingly, in an embodiment of the signal providing apparatus 100 according to an embodiment of the inventive concept, the first signal may be input as a first input signal in1 through the first input signal line, the second signal may be input as a second input signal in2 through the second input signal line, the first signal and the third signal generated in response to the first signal may be output as first output signals out2 through the first signal line 110, and the second signal and the third signal may be output as second output signals out2 through the second signal line 120. The first signal line 110 and the second signal line 120 may be connected to the first input signal line through the line controller, respectively. Also, in the signal providing apparatus 100 according to an embodiment of the inventive concept, the first signal and the third signal may be sequentially output as first output signals out1, and the second signal and the third signal may be sequentially output as second output signals out2.

In the signal providing apparatus 100 according to another embodiment of the inventive concept, the first signal and the second signal may be sequentially input as input signals through the input signal line, and the first signal, the second signal, and the third signal generated in response to the first signal may be sequentially output as output signals through the first signal line 110. Accordingly, the input signal line and the first signal input 110 may be connected through the line controller.

The signal providing apparatuses 100 according to one embodiment and another embodiment of the inventive concept as described above may include the signal generation unit 150 generating the third signal in response to the first signal, the third signal line 140 connecting the first signal line 110 and/or the second signal line 120 and the signal generation unit 150, and the line controller(s) 141 and/or 143 controlling a transmission of the first signal and the third signal through the third signal line 140.

Figure 7:
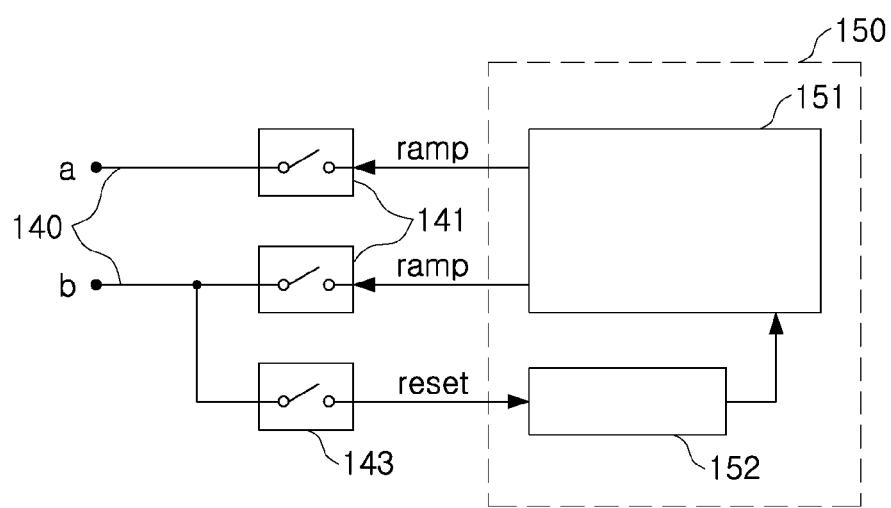
FIG. 7 is a view showing a configuration of a signal generation unit of the signal providing apparatus according to an embodiment of the inventive concept.

FIG. 7 is a view showing a configuration of the signal generation unit 150 of the signal providing apparatus according to an embodiment of the inventive concept. Namely, FIG. 7 illustrates the signal generation unit 150 applicable to the signal providing apparatus 100 illustrated in FIG. 5B.

With reference to FIG. 7, the signal generation unit 150 according to an embodiment of the inventive concept may include an analog-to-digital converter (ADC) 152 and a ramp signal generator 151.

The ADC 152 may convert the level of the reset signal (reset) into a digital value. The ramp signal generator 151 may generate the ramp signal (ramp) by using the digital value with respect to the level of the reset signal (reset).

The ramp signal (ramp) is a signal generated based on reset signal level information by using level information of the reset signal. As necessary, the ramp signal (ramp) may be a signal which uses the level of the reset signal (reset) as a start level and the ramp signal (ramp) level is sequentially increased or decreased. Variation of the ramp signal (ramp) level and length, and the like, may be previously set.

In addition, the ramp signal (ramp) may be generated by combining the level information of the reset signal (reset) with a pre-set parameter.

Also, although not shown, the signal generation unit 150 may receive the reset signal (reset) as an analog signal to generate the ramp signal (ramp). As necessary, the signal generation unit 150 may include a capacitor for canceling a noise component at the input terminal receiving the reset signal (reset).

Also, the signal generation units 150 of the signal providing apparatuses illustrated in FIGS. 5A, 5C, and 5D have a configuration which is the same as or similar to that illustrated in FIG. 7.

Also, in the above description in relation to FIG. 7, the signal providing apparatus 100 according to an embodiment of the inventive concept is provided to the image sensor, but the signal providing apparatus 100 according to an embodiment of the inventive concept may be applicable to various fields. Namely, the signal providing apparatus 100 according to an embodiment of the inventive concept may include the ADC 152 receiving a first signal and outputting a digital value corresponding to the first signal level, and the ramp signal generator 151 generating a third signal using the outputted digital value, and accordingly, the third signal may be a signal which is decreased or increased by using the level of the outputted digital value as a starting level.

Figure 8:
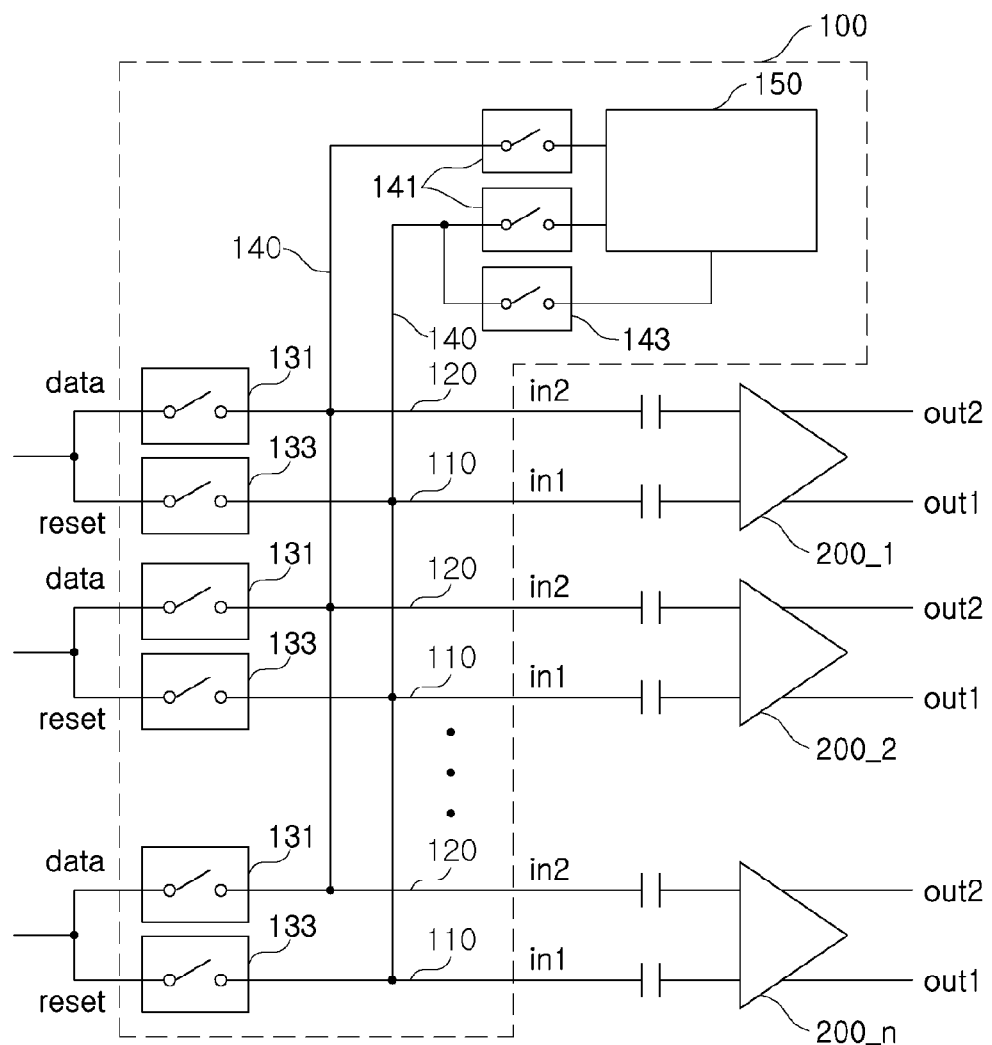
FIG. 8 is a view showing a configuration of another implementation of the signal providing apparatus according to an embodiment of the inventive concept.

FIG. 8 is a view showing a configuration of another implementation example of the signal providing apparatus according to an embodiment of the inventive concept.

With reference to FIG. 8, in the signal providing apparatus 100 according to an embodiment of the inventive concept, a plurality of first signal lines 110 and a plurality of second signal lines 120 may be connected to the third signal line(s) 140.

The signal generation unit 150 may receive first signals (e.g., reset signals (reset)) transferred through the plurality of first signal lines 110. The signal generation unit 150 may generate a third signal (e.g., a ramp signal (ramp)) by synthesizing level information of the received first signals (e.g., the reset signals (reset)). Also, the third signal (e.g., the ramp signal (ramp)) generated by the signal generation unit 150 may be applied to the plurality of first signal lines 110 and the plurality of second signal lines 120 so as to be transferred to multi-signal comparators 200_1, 200_2, ..., 200_n.

Also, with reference to FIG. 8, the signal providing apparatus 100 according to an embodiment of the inventive concept can be applicable to an analog-to-digital converting apparatus. The analog-to-digital converting apparatus may be an analog-to-digital converting apparatus employing a column-parallel analog-to-digital conversion scheme.

Since a plurality of columns in which data from the pixel array 500 is transferred exist in the image sensor, the reset signals transferred in each column are transferred to the signal generation unit 150, and the signal generation unit 150 may average the reset signals to generate a ramp signal. The generated ramp signal may be transferred to first and second input terminals 1 and 2 of the multi-signal comparison units 200 at the rear stage.

The analog-to-digital converting apparatus including the signal providing apparatus 100 illustrated in FIG. 8 may receive the reset signal from the operational region 510 (see FIG. 2), rather than from the non-operational region 520 (see FIG. 2). Also, the analog-to-digital converting apparatus use the existing lines transferring the ramp signal as it is, without using any additional line for receiving the reset signal. Thus, the circuit can be easily implemented and the existing line may be used as it is as a line for receiving the reset signal.

Figure 9:
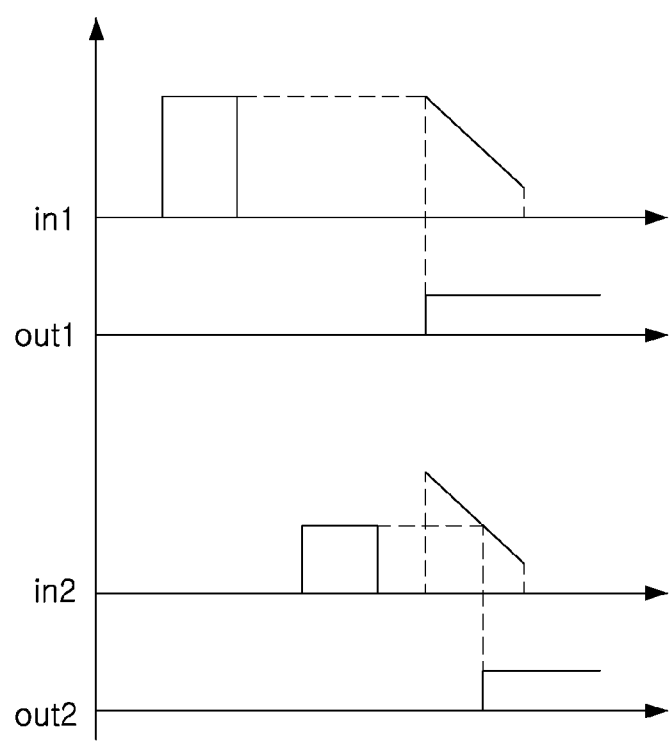
FIG. 9 is a timing diagram showing timings of input and output signals from a multi-signal comparison unit of an analog-to-digital converting apparatus using the signal providing apparatus according to an embodiment of the inventive concept.

FIG. 9 is a timing diagram showing timing of input and output signals from the multi-signal comparison unit 200 of an analog-to-digital converting apparatus using the signal providing apparatus 100 according to an embodiment of the inventive concept. The multi-signal comparison unit 200 of the analog-to-digital converting apparatus using the signal providing apparatus 100 according to an embodiment of the inventive concept may have the same configuration as illustrated in FIG. 3(*a*).

Hereinafter, operations of the multi-signal comparison unit 200 of the analog-to-digital converting apparatus using the signal providing apparatus 100 will be described with reference to FIGS. 9 and 3(*a*).

A first signal is input to the first input terminal IN1 of the multi-signal comparison unit 200, and a second signal is input to the second input terminal IN2. Thereafter, a third signal is input to the first input terminal IN1 and the second input terminal IN2. In particular, the third signal transferred after being generated in the signal providing apparatus 100 according to an embodiment of the inventive concept is a signal which has been generated based on the first signal by using the first signal as an initial or starting level, so an initial level of the third signal may be identical to that of the first signal.

Upon receiving the third signal, the multi-signal comparison unit 200 compares the level of the third signal with levels of the first and second signals, and outputs, to the first output terminal OUT1 and the second output terminal OUT2, an indication of the time at which the amplitudes of the signals are changed. The first output terminal OUT1 may compare the level of the first signal and that of the third signal, and when the level of the first signal is increased to be higher than the third signal, the first output terminal OUT1 may output a high level signal. The second output terminal OUT2 may compare the level of the second signal and that of the third signal, and when the level of the second signal is increased to be higher than the third signal, the second output terminal OUT2 may output a high level signal.

When the first signal is applied to the first input terminal IN1, the first signal may be stored in a first capacitor connected to the first input terminal IN1, and the multi-signal comparison unit 200 may compare the level of the first signal stored in the first capacitor and that of the third signal, to determine a time at which (when) a signal output to the first output terminal OUT1 is changed to have a high level. Also, when the second signal is applied to the second input terminal IN2, the second signal may be stored in a second capacitor connected to the second input terminal IN2, and the multi-signal comparison unit 200 may compare the level of the second signal stored in the second capacitor and that of the third signal to determine a time at which (when) a signal output to the second output terminal OUT2 is changed to have a high level.

Examples of the column-parallel analog-to-digital conversion of the image sensor will be described.

The reset signal (reset) is applied as a first input signal in1 to the first input terminal IN1 of the multi-signal comparison unit 200, and the data signal (data) is applied as a second input signal in2 to the second input terminal IN2 of the multi-signal comparison unit 200. Thereafter, the ramp signal (ramp) is applied as a first input signal in1 to the first input terminal IN1 and the ramp signal (ramp) is applied as a second input signal in2 to the second input terminal IN2. The ramp signal (ramp) is a signal generated based on the reset signal (reset) by using the reset signal (reset), and a start level of the ramp signal (ramp) may be set to the level of the reset signal (reset) and the ramp signal (ramp) may be a signal which is linearly reduced from the start level. The ramp signal (ramp) may be generated from the signal generation unit 150 of the signal providing apparatus 100.

When the ramp signal (ramp) is applied (or received), the multi-signal comparison unit 200 may compare the levels of the reset signal (reset) and the data signal (data) to that of the ramp signal (ramp) and output a timing signal when the amplitudes of the compared signals are changed, from the first output terminal OUT1 and the second output terminal OUT2, respectively. For example, a first timing signal out1, which is activated to have a high level when the level of the reset signal (reset) is increased to be higher than that of the ramp signal (ramp), may be output from the first output terminal OUT1, and a second timing signal out2, which is activated to have a high level when the level of the data signal (data) is increased to be higher than that of the ramp signal (ramp), may be output from the second output terminal OUT2.

When the ramp signal (ramp) is applied (or received), the multi-signal comparison unit 200 may compare the levels of the already applied reset signal (reset) and the data signal (data) and that of the ramp signal (ramp) and output a timing signal when the amplitudes of the signals are changed, from the first output terminal OUT1 and the second output terminal OUT2, respectively. For example, a first timing signal out1, which is activated to have a high level when the level of the reset signal (reset) is increased to be higher than that of the ramp signal (ramp), may be output from the first output terminal OUT1, and a second timing signal out2, which is activated to have a high level when the level of the data signal (data) is increased to be higher than that of the ramp signal (ramp), may be output from the second output terminal OUT2. In the present embodiment, since the start level of the ramp signal (ramp) is identical to that of the reset signal (reset), when the ramp signal (ramp) is provided, the first timing signal OUT1 output from the first output terminal OUT1 has a high level immediately.

According to an embodiment, since the start level of the ramp signal is identical to that of the reset signal in the signal providing apparatus 100, the operation of the multi-signal comparison unit 200 can be stabilized.

Figure 10:
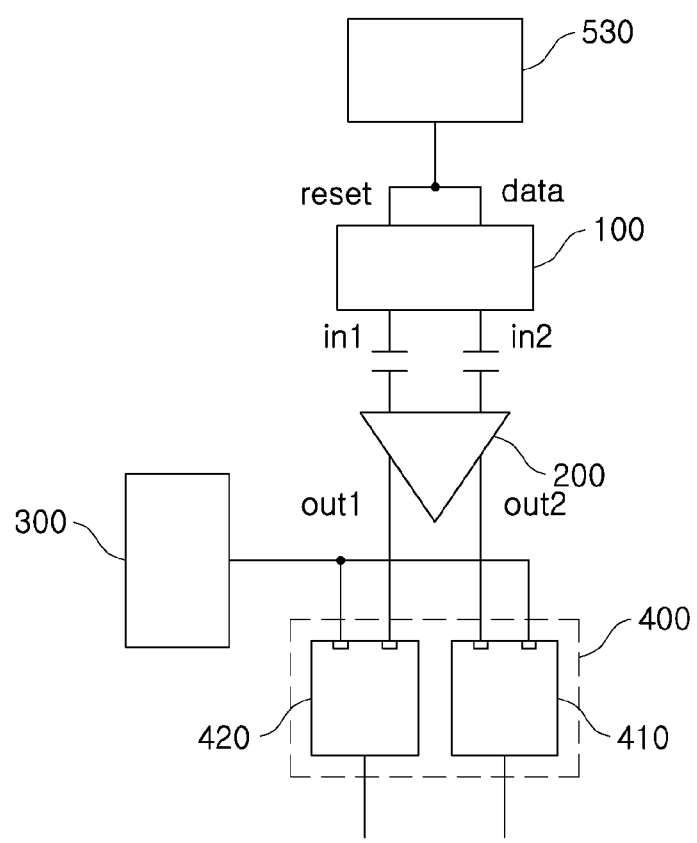
FIG. 10 is a view showing a configuration of the analog-to-digital converting apparatus using the signal providing apparatus according to an embodiment of the inventive concept.

FIG. 10 is a view showing a configuration of the analog-to-digital converting apparatus using the signal providing apparatus according to an embodiment of the inventive concept.

With reference to FIG. 10, the analog-to-digital converting apparatus according to an embodiment of the inventive concept may include the signal providing apparatus 100, the multi-signal comparison unit 200, the counter unit 300, and the storage unit 400. The storage unit 400 may include the first storage 410 and the second storage 420. In FIG. 10, reference numeral 530 denotes image pixels of the pixel array 500.

The signal providing apparatus 100 may receive a first data signal and a second data signal and sequentially provide the first data signal, the second data signal, and a comparison signal. In detail, the signal providing apparatus 100 may receive a reset signal (reset), generate a ramp signal (ramp), sequentially output the reset signal (reset) and the ramp signal (ramp) as first input signals in1, and sequentially output the data signal (data) and the ramp signal (ramp) as second input signals int. A detailed operation of the signal providing apparatus 100 has been described above.

The multi-signal comparison unit 200 outputs a first timing signal when the amplitude of the first data signal and that of the comparison signal are changed, and the multi-signal comparison unit 200 outputs a second timing signal when the amplitude of the second data signal and that of the comparison signal are changed. In detail, the multi-signal comparison unit 200 may output the first timing signal out1 activated at a time at which the ramp signal (ramp) becomes lower than the reset signal (reset) and the second timing signal out2 activated at a time at which the ramp signal (ramp) becomes smaller than the data signal (data). A detailed operation of the multi-signal comparison unit 200 has been described above.

The counter unit 300 may output a counter signal having a value which is increased or decreased over time. When the counter signal is outputted and when the comparison signal (i.e., the ramp signal (ramp)) is supplied may be synchronized. For example, the counter signal may be outputted when the ramp signal (ramp) is applied to the multi-signal comparison unit 200.

The storage unit 400 may store the counter signal when the first timing signal out1 is transferred and store the counter signal when the second timing signal out2 is transferred. The storage unit 400 may include the first storage 410 storing the counter signal when the first timing signal is transferred and the second storage 420 storing the counter signal when the second timing signal is transferred. Although not shown, the first storage 410 and the second storage 420 may include a latch storing configured to store information comprising at least a plurality of bits. The latch may store a signal applied to a data input terminal at a rising edge of a signal applied to a clock input terminal. The counter signal is applied to the data input terminal, and the first or second timing signal may be applied to the clock input terminal.

Namely, a value of a counter signal indicating when the amplitudes of the first data signal and the comparison signal are changed may be stored in the first storage unit 410, and a value of a counter signal indicating when the amplitudes of the second data signal and the comparison signal are changed may be stored in the second storage unit 420.

A case in which the analog-to-digital converting apparatus operates on the image pixel array 500 will be described as an example. The reset signal (reset) and the data signal (data) are sequentially output from the image pixel 530 of the pixel array 530. The signal providing apparatus 100 receives the reset signal (reset) and the data signal (data), generates a ramp signal (ramp) by using the reset signal, and sequentially transfers the reset signal (reset), the data signal (data), and the ramp signal (ramp). Here, the signal providing apparatus 100 may sequentially transfer the reset signal (reset) and the ramp signal (ramp) as first input signals in1 to the multi-signal comparison unit 200, and the signal providing apparatus 100 may sequentially transfer the data signal (data) and the ramp signal (ramp) as second input signals in2 to the multi-signal comparison unit 200.

After the reset signal (reset) and the data signal (data) are received, when the ramp signal (ramp) is transferred, the multi-signal comparison unit 200 compares the ramp signal (ramp) and the reset signal (reset) to generate the first timing signal out1, transfers the first timing signal out1 to the first storage 410, compares the ramp signal (ramp) and the data signal (data) to generate the second timing signal out2, and transfers the second timing signal out2 to the second storage 420.

The value of the counter signal of the time at which the first timing signal out1 was activated is stored in the first storage 410, and the value of the counter signal of the time at which the second timing signal out2 was activated is stored in the second storage 420. Thus, the values of the counter signals stored in the first storage unit 410 and the second storage unit 420 are proportional to the levels of the reset signal and the data signal. The ramp signal and the counter signal may be synchronized.

The values of the counter signals stored in the first storage 410 and the second storage 420 may be transferred to the calculation apparatus. Accordingly, the calculation apparatus may calculate magnitudes of the levels of the reset signal and the data signal in consideration of the received values of the counter signals and a pre-set variation of the ramp signal.

As described above, by using the signal providing apparatus 100 according to an embodiment of the inventive concept, a signal in association with a transferred signal is generated and additionally transferred to a rear stage of the signal providing apparatus 100. When the signal providing apparatus 100 is applied to the analog-to-digital converting apparatus, operation stability of the analog-to-digital converting apparatus can be enhanced. Also, by applying the signal providing apparatus 100 according to an embodiment of the inventive concept to the image pixel, such an additional signal line for obtaining a reset signal as required in the related art can be eliminated, obtaining an advantage in terms of circuit design.

As set forth above, according to embodiments of the inventive concept, the signal providing apparatus can generate a signal in association with a transferred signal, and transfer the transferred signal and the generated signal to the rear stage of the signal providing apparatus. When the signal providing apparatus according to an embodiment of the inventive concept is used in an analog-to-digital converting apparatus, the operational stability of the analog-to-digital converting apparatus can be enhanced. When the signal providing apparatus according to an embodiment of the inventive concept is applied to an image sensor, the level of a reset signal of an image pixel and a start level of a ramp signal can become identical, preventing an occurrence of an error of image data and reducing the number of required column lines, which results in a reduction in a layout area of the image sensor.

While the inventive concept has been shown and described in connection with some embodiments, it will be apparent to those skilled in the art that modifications and variations can be made without departing from the spirit and scope of the invention as defined by the appended claims.

What is claimed is:

1. A signal providing apparatus comprising:
   a first signal line transferring a first signal and a third signal;
   a second signal line transferring a second signal and the third signal;
   a third signal line connected to the first and second signal lines; and
   a signal generation unit receiving the first signal through the third signal line while the first signal is being transferred through the first signal line, generating the third signal by using level information of the first signal, and providing the third signal to each of the first and second signal lines through the third signal line,
   wherein the second signal and the third signal are transferred through the second signal line at different times, and
   wherein the signal generation unit comprises:
   an analog-to-digital converter (ADC) converting the level of the first signal into a digital value; and
   a signal generator generating the third signal by using the digital value with respect to the level of the first signal.

2. The signal providing apparatus of claim 1, wherein after the second signal is transferred to the second signal line, the third signal is transferred to the second signal line.

3. The signal providing apparatus of claim 2, wherein the first signal is transferred before the second signal is transferred.

4. The signal providing apparatus of claim 1, further comprising:
   a first line controller controlling a transfer of the first signal through the first signal line; and
   a second line controller controlling a transfer of the second signal through the second signal line.

5. The signal providing apparatus of claim 1, wherein the signal providing apparatus further comprises a third line controller controlling a transfer of the first signal and a transfer of the third signal through the third signal line.

6. The signal providing apparatus of claim 1, wherein the third signal is a signal using the level of the first signal as a start level and having a level which is sequentially increased or decreased.

7. A signal providing apparatus comprising:
   a first signal line transferring a first signal, a second signal, and a third signal;
   a third signal line connected to the first signal line; and
   a signal generation unit receiving the first signal through the third signal line while the first signal is being transferred through the first signal line, generating the third signal by using level information of the first signal, and providing the third signal to the first signal line through the third signal line,
   wherein the first signal, the second signal, and the third signal are transferred through the first signal line at different times, and
   wherein the signal generation unit comprises:
   an analog-to-digital converter (ADC) converting the level of the first signal into a digital value; and
   a signal generator generating the third signal by using the digital value with respect to the level of the first signal.

8. The signal providing apparatus of claim 7, wherein the first, second, and third signals are transferred in order of the first signal, the second signal, and the third signal through the first signal line.

* * * * *